(12) United States Patent
Shue et al.

(10) Patent No.: US 6,900,389 B2
(45) Date of Patent: May 31, 2005

(54) COVER FOR BALL-GRID ARRAY CONNECTOR

(75) Inventors: Thomas L. Shue, Red Lion, PA (US); Matthew S. Emenheiser, Mount Wolf, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 10/340,279

(22) Filed: Jan. 10, 2003

(65) Prior Publication Data

US 2004/0134676 A1 Jul. 15, 2004

(51) Int. Cl.$^7$ ................................................ H05A 5/03
(52) U.S. Cl. ........................ 174/52.1; 361/690; 361/722
(58) Field of Search ..................... 174/52.1, 52.4; 439/79, 80, 83, 74, 71; 361/690, 718, 719, 722

(56) References Cited

U.S. PATENT DOCUMENTS

| | | | |
|---|---|---|---|
| 4,217,024 A | 8/1980 | Aldridge et al. | 339/275 |
| 4,536,955 A | 8/1985 | Gudgeon | 29/840 |
| 4,767,344 A | 8/1988 | Noschese | 439/83 |
| 4,878,611 A | 11/1989 | LoVasco et al. | 228/180.2 |
| 5,214,308 A | 5/1993 | Nishiguchi et al. | 257/692 |
| 5,490,040 A | 2/1996 | Gavdenzi et al. | 361/773 |
| 5,637,008 A | 6/1997 | Kozel | 439/342 |
| 5,691,041 A | 11/1997 | Frankeny et al. | 428/209 |
| 5,702,255 A * | 12/1997 | Murphy et al. | 439/71 |
| 5,742,484 A | 4/1998 | Gillette et al. | 361/789 |
| 5,743,009 A | 4/1998 | Matsui et al. | 29/843 |
| 5,755,595 A | 5/1998 | Davis et al. | 439/607 |
| 5,810,607 A | 9/1998 | Shih et al. | 439/66 |
| 5,874,776 A | 2/1999 | Kresge et al. | 257/747 |
| 5,876,219 A | 3/1999 | Taylor et al. | 439/74 |
| 5,883,782 A | 3/1999 | Thurston et al. | 364/704 |
| 5,888,884 A | 3/1999 | Wojnarowski | 438/462 |
| 5,919,050 A | 7/1999 | Kehley et al. | 439/71 |
| 5,955,888 A | 9/1999 | Frederickson et al. | 324/761 |
| 5,984,726 A | 11/1999 | Wu | 439/607 |
| 6,012,948 A | 1/2000 | Wu | 439/567 |
| 6,059,170 A | 5/2000 | Jimarez et al. | 228/119 |
| 6,089,878 A | 7/2000 | Meng | 439/79 |
| 6,152,756 A | 11/2000 | Huang et al. | 439/342 |
| 6,174,198 B1 | 1/2001 | Wu et al. | 439/541.5 |
| 6,183,301 B1 | 2/2001 | Paagman | 439/608 |
| 6,196,871 B1 | 3/2001 | Szu | 439/571 |
| 6,202,916 B1 | 3/2001 | Updike et al. | 228/180 |
| 6,210,197 B1 | 4/2001 | Yu | 439/342 |
| 6,215,180 B1 | 4/2001 | Chen et al. | 257/720 |
| 6,220,884 B1 | 4/2001 | Lin | 439/342 |
| 6,220,895 B1 | 4/2001 | Lin | 439/607 |
| 6,544,046 B1 * | 4/2003 | Hahn et al. | 439/83 |
| 6,672,907 B2 * | 1/2004 | Azuma | 439/682 |

FOREIGN PATENT DOCUMENTS

| | | |
|---|---|---|
| EP | 0 789 422 A2 | 8/1997 |
| JP | 0 812 5379 | 5/1996 |
| WO | WO 97/43885 | 11/1997 |
| WO | WO 97/44859 | 11/1997 |
| WO | WO 98/15989 | 4/1998 |

OTHER PUBLICATIONS

U.S. Appl. No. 09/691,811, filed Oct. 19, 2000, (FCI–2550).

* cited by examiner

*Primary Examiner*—Dean A. Reichard
*Assistant Examiner*—Carmelo Oliva
(74) *Attorney, Agent, or Firm*—Woodcock Washburn LLP

(57) ABSTRACT

A presently-preferred embodiment of a cover for a ball-grid array connector comprises a top member and a first and a second side member adjoining opposing ends of the top member. The first and the second side members each have a mating feature formed thereon for engaging a housing of the ball-grid array connector by way of a respective complementary mating feature formed in the housing so that the cover is movable between a first and a second position in relation to the housing.

22 Claims, 6 Drawing Sheets

COVER FOR BALL-GRID ARRAY CONNECTOR

FIELD OF THE INVENTION

The present invention relates to a cover for a ball-grid array ("BGA") connector and, more particularly, to a cover that insulates portions of the BGA connector as the BGA connector is installed on a circuit substrate. The invention also relates to a method for mounting a ball-grid array connector on a circuit substrate.

BACKGROUND OF THE INVENTION

BGA connectors are used in many applications where a low-profile, high-density electrical connector is desired or required. A typical BGA connector comprises a receptacle, and a header that mates with the receptacle. The header can have a plurality of through holes formed therein. A plurality of male contacts are positioned within the through holes. The male contacts mate with female contacts of the receptacle to establish electrical contact between the header and the receptacle.

Each male contact of the header can have a ball-shaped piece of solder material fixed to an end thereof. The solder balls are located directly below the housing, and form a grid array. The header is mounted on a circuit substrate by aligning the grid array with a corresponding array of electrical contact points, e.g., solder pads, on a surface of the substrate. Heated gas, e.g., air, is subsequently directed over the header to melt the solder balls and form a solder joint between each male contact and a corresponding solder pad (this process is commonly referred to as "solder reflow").

The substrate, in general, must be substantially horizontal and the mounting surface must be facing upward during the solder reflow process. This requirement is generated by the need to ensure that the liquefied solder from each solder ball flows onto (and remains on) the corresponding solder pad on the mounting surface. Hence, a second header, in general, cannot be mounted on a second surface of the substrate while the first header is being secured to an opposing first surface thereof. Instead, the substrate must be rotated (flipped) after the first header has been mounted so that the second surface is facing upward as the second header is mounted. Hence, the first header is suspended (hangs) from the first surface by the newly-formed solder joints on the first surface while the second header is mounted on the second surface.

Mounting a first and a second header in the above-noted manner presents difficulties. In particular, the heated gas used to melt (reflow) the solder balls of the second header also heats the newly formed solder joints on the first surface. This heating, in conjunction with the stresses in the solder joints caused by suspending the first header therefrom, can weaken and, in extreme cases, can melt the solder joints. This problem is particularly troublesome in applications where the headers being mounted are relatively heavy.

SUMMARY OF THE INVENTION

A presently-preferred embodiment of a cover for a ball-grid array connector comprises a top member and a first and a second side member adjoining opposing ends of the top member. The first and second side members each have a raised portion formed thereon for engaging a housing of the ball grid array connector by way of respective slots formed in the housing. The raised portions are configured to slide within the respective slots so that the cover is movable in relation to the housing when the cover is mated with the ball-grid array connector.

Another presently-preferred embodiment of a cover for a ball-grid array connector comprises a top member and a first and a second side member adjoining opposing ends of the top member. The first and the second side members each have a mating feature formed thereon for engaging a housing of the ball-grid array connector by way of a respective complementary mating feature formed in the housing so that the cover is movable between a first and a second position in relation to the housing.

A presently-preferred embodiment of a kit for mounting a ball-grid array connector on a substrate comprises the ball-grid array connector. The ball-grid array connector comprising a housing, a plurality of electrical contacts mounted within the housing, and a grid array of fusible elements each being mechanically coupled to a respective one of the electrically-conductive elements.

A presently-preferred embodiment of a kit further comprises a cover for mating with the housing. The cover is movable between a first position wherein a portion of the cover is closely spaced from the housing so that the cover substantially isolates the electrical contacts from a heated gas flowing over the ball-grid array connector, and a second position wherein the portion of the cover is spaced from the housing so that the heated gas enters the housing and heats the electrical contacts.

Another presently-preferred embodiment of a kit for mounting a ball-grid array connector on a substrate comprises the ball-grid array connector. The ball-grid array connector comprises a housing having mating features for engaging complementary mating features on a second connector matable with the ball-grid array connector, a plurality of electrical contacts mounted on the housing, and a grid array of fusible elements each mechanically coupled to a respective one of the electrical contacts.

A presently-preferred embodiment of a kit further comprises a cover for mating with the ball-grid array connector and having mating features that engage the mating features of the ball-grid array connector. The cover is movable between a first and a second position in relation to the ball-grid array connector.

A presently-preferred method for mounting a first and a second ball-grid array connector on a circuit substrate comprises positioning the first ball-grid array connector on a first surface of the circuit substrate so that a first plurality of fusible members on the first ball-grid array connector substantially align with respective electrical-contact points on the first surface, and directing a first stream of heated gas over the first ball-grid array connector while a cover mated with a housing of the first ball-grid array connector is an open position that permits the first stream of heated gas to enter the housing and thereby melt the fusible members and form a plurality of solder joints.

A presently-preferred method further comprises positioning the second ball-grid array connector on a second surface of the circuit substrate so that a plurality of fusible members on the second ball-grid array connector substantially align with respective electrical-contact points on the second surface, and directing a second stream of heated gas over the first and second ball-grid array connectors while the cover is in a closed position that substantially prevents the second stream from entering the housing and melting the plurality of solder joints.

Another presently-preferred method for mounting a first and a second ball-grid array connector on a circuit substrate comprises positioning the first ball-grid array connector on the circuit substrate, flowing heated gas over the first ball-grid array connector while a cover mated to the first ball-grid array connector is in an open position, positioning the second ball-grid array connector on the substrate, and flowing heated gas over the first and second ball-grid array connectors while the cover is in a closed position.

BRIEF DESCRIPTION OF THE DRAWINGS

The foregoing summary, as well as the following detailed description of a presently-preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PRESENTLY-PREFERRED METHOD

Figure 1:
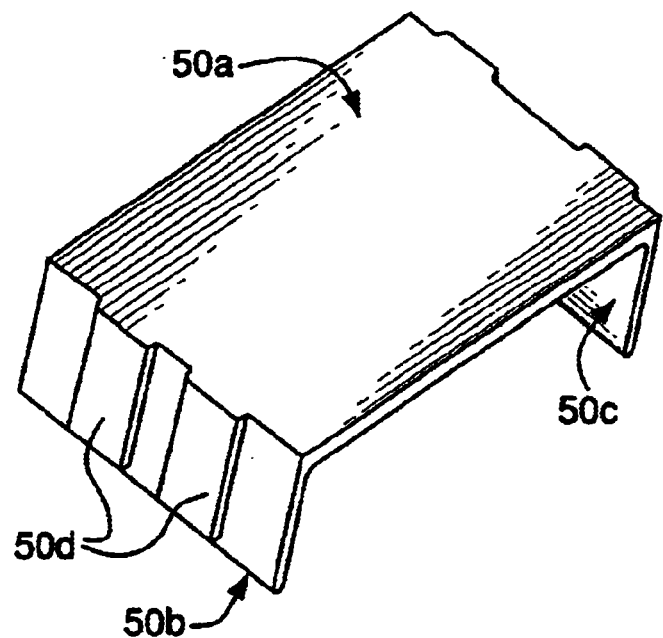
FIG. 1 is a top perspective view of a cover for a BGA connector in accordance with the present invention.
Figure 2:
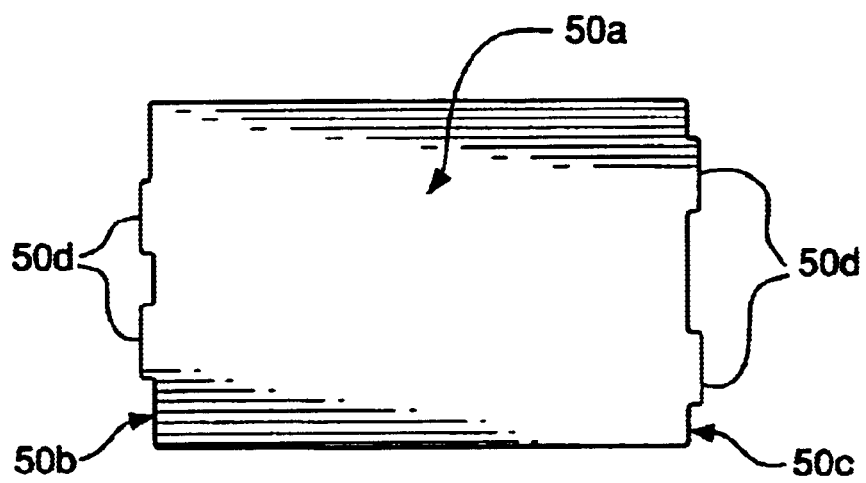
FIG. 2 is top view of the cover shown in FIG. 1.
Figure 3:
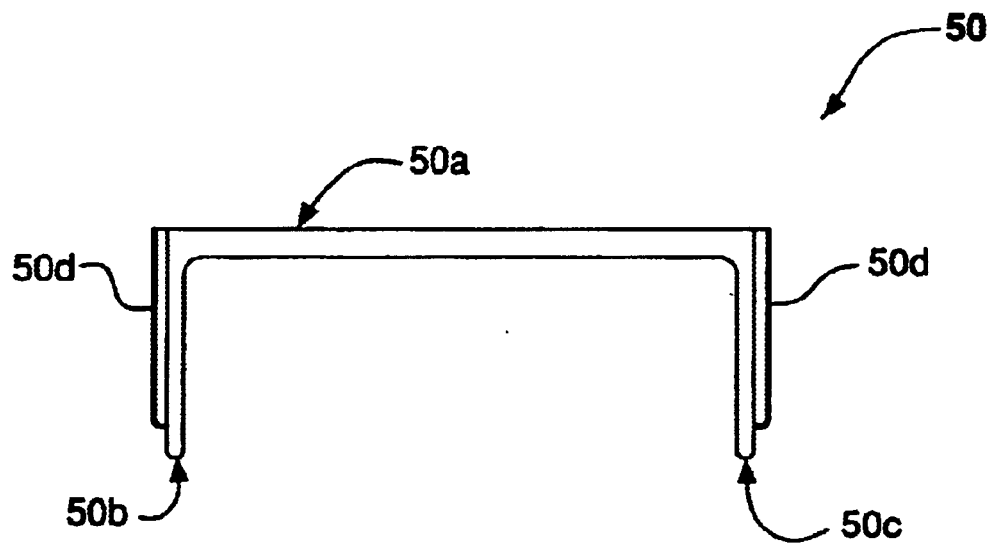
FIG. 3 is a front of the cover shown in FIGS. 1 and 2.
Figure 4:
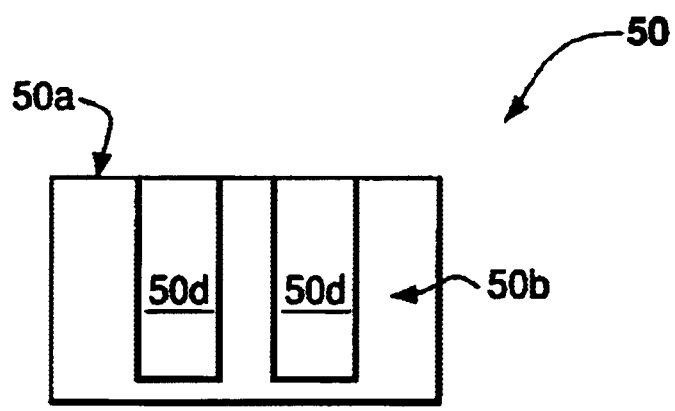
FIG. 4 is side view of the cover shown in FIGS. 1–3.

The figures depict a first and a second BGA header 12, 12', and a first and a second receptacle 13, 13' for mating with the respective headers 12, 12'. The figures also depict a first and second cover 50, 50' for mating with the respective headers 12, 12' as the headers 12, 12' are mounted on a circuit substrate. Specific details relating to the headers 12, 12' and the receptacles 13, 13' are presented for exemplary purposes only, as the covers 50, 50' can be configured for use with other types of BGA connectors.

The first header 12 is configured to be mounted on a first surface 14a of a circuit substrate such as a PCB 14 (see FIGS. 5–7 and 9–13). The second header 12' is configured to be mounted on a second surface 14b of the PCB 14 (see FIG. 11). The receptacle 13 is configured to be mounted on a second circuit substrate such as a backplane 15, and the receptacle 13' is configured to be mounted on a third circuit substrate such as a backplane similar to the backplane 15 (see FIGS. 9 and 10).

The second header 12' is substantially identical to the first header 12. Corresponding components of the headers 12, 12' are designated herein by identical reference numerals, with the reference numerals corresponding to the second header 12' followed by a prime (') symbol. The following description of the first header 12 applies equally to the second header 12', unless otherwise noted.

Figure 5:
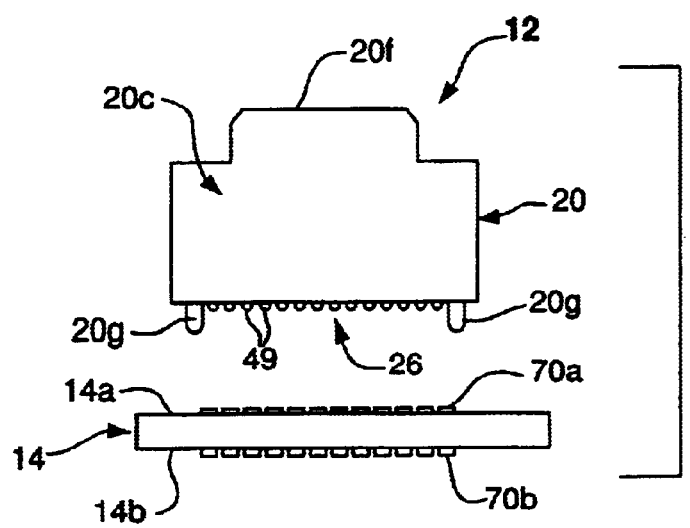
FIG. 5 is a side view of a BGA header for use with the cover shown in FIGS. 1–5, and a printed-circuit board (PCB) for mounting the BGA header.
Figure 6:
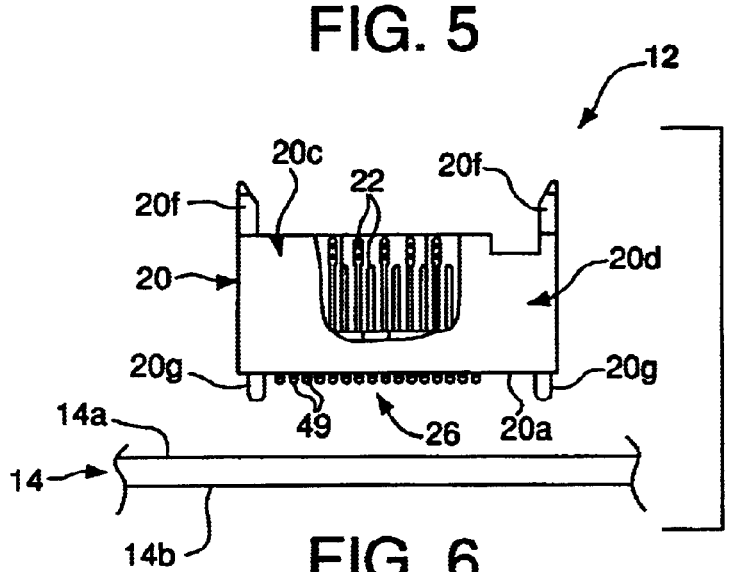
FIG. 6 is a side view of the BGA header and the PCB shown in FIG. 5, from a perspective rotated ninety degrees from the perspective of FIG. 5.
Figure 7:
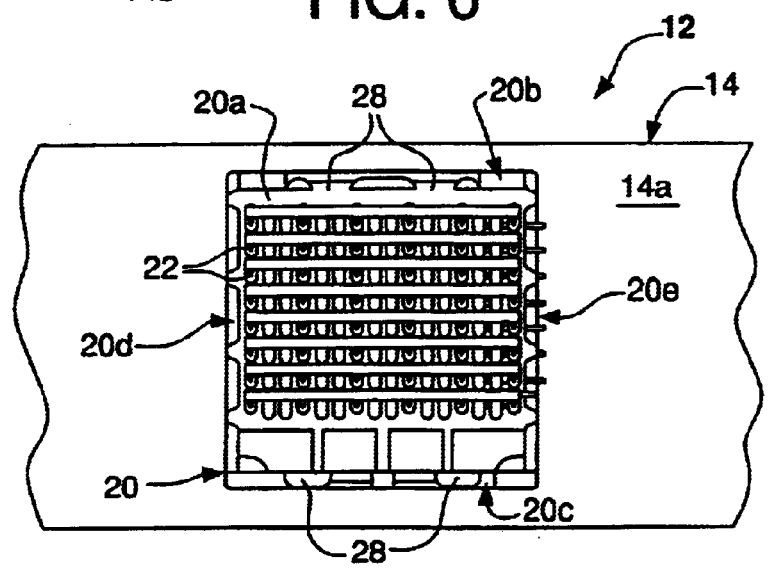
FIG. 7 is a top view of the BGA header and PCB shown in FIGS. 5 and 6.

The first header 12 comprises an electrically-insulative housing 20 (see FIGS. 5–7). The housing 20 comprises a bottom portion 20a, a first pair of opposing side portions 20b, 20c, and a second pair of opposing side portions 20d, 20e.

The header 12 comprises a plurality of electrically-conductive male contacts 22 arranged in an eight row, five column array. A plurality of through holes (not shown) are formed in the bottom portion 20a. The male contacts 22 are each press fit into a respective through hole. A first end of each male contact 22 extends into a respective recess (not shown) formed in a bottom surface of the bottom portion 20a. A second end of each male contact 22 extends upward into the housing 20.

(It should be noted that directional terms such as "top," "bottom," "vertical," "horizontal," etc. are used in reference to the component orientations depicted in the figures). These terms are used for illustrative purposes only, and are not meant to limit the scope of the appended claims.)

A fusible element is attached to a lower end of each male contact 22, i.e., to the end of the male contact 22 that projects into the corresponding recess below the bottom portion 20a. The fusible element can be, for example, a hemispherical solder ball 49, although other suitable types of fusible elements can also be used. The solder balls 49 collectively form a ball grid array 26. The ball grid array 26 is used to electrically and mechanically couple the header 12 to the PCB 14, as explained in detail below.

The housing 20 includes mating features that permit the header 12 to mate with the receptacle 13. In particular, two vertically-extending slots 28 are formed in the inwardly-facing surface of each side portion 20b, 20c. The slots 28 formed in the side portion 20b are spaced apart by a first distance, and the slots 28 formed in the side portion 20c are spaced apart by a second distance that is unequal to the first distance. Moreover, a tab 20f is formed on and projects upward from each of the side portions 20b, 20c. Operational details relating to these features are presented below.

The housing 20 further comprises a plurality of mounting legs 20g. The mounting legs 20g are each coated with a thin layer of solder, and are used to position and retain the header 12 on the PCB 14, as explained in further detail below.

The second receptacle 13' is substantially identical to the first receptacle 13. Corresponding components of the receptacle 13, 13' are designated herein by identical reference numerals, with the reference numerals corresponding to the second receptacle 13' followed by a prime (') symbol. The following description of the first receptacle 13 applies equally to the second receptacle 13', unless otherwise noted.

Figure 8:
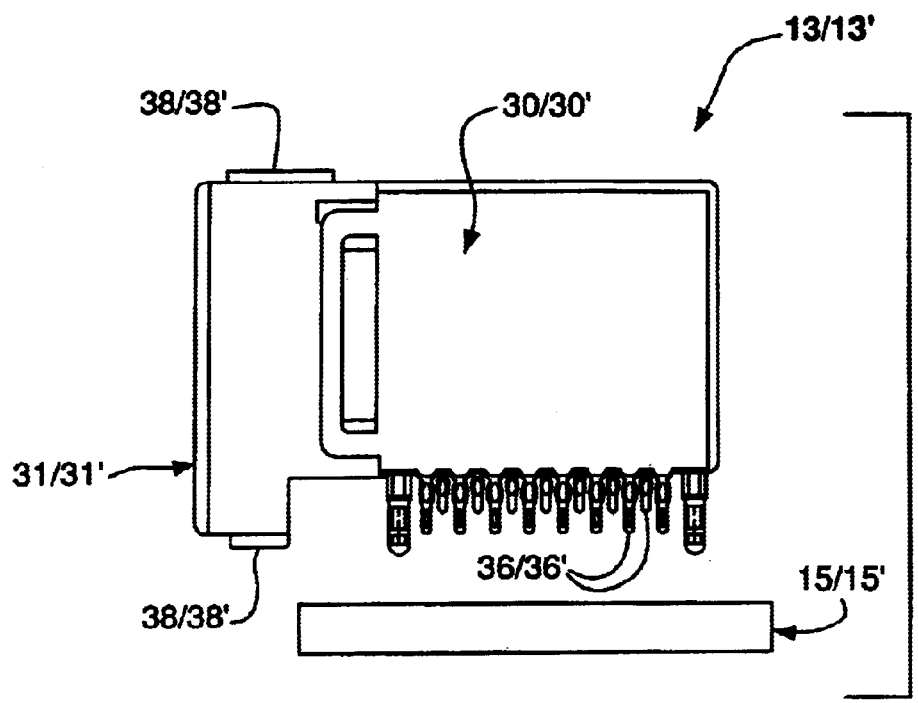
FIG. 8 is a side view of a receptacle for mating with the BGA header shown in FIGS. 5–7, and a backplane for mounting the receptacle.
Figure 9:
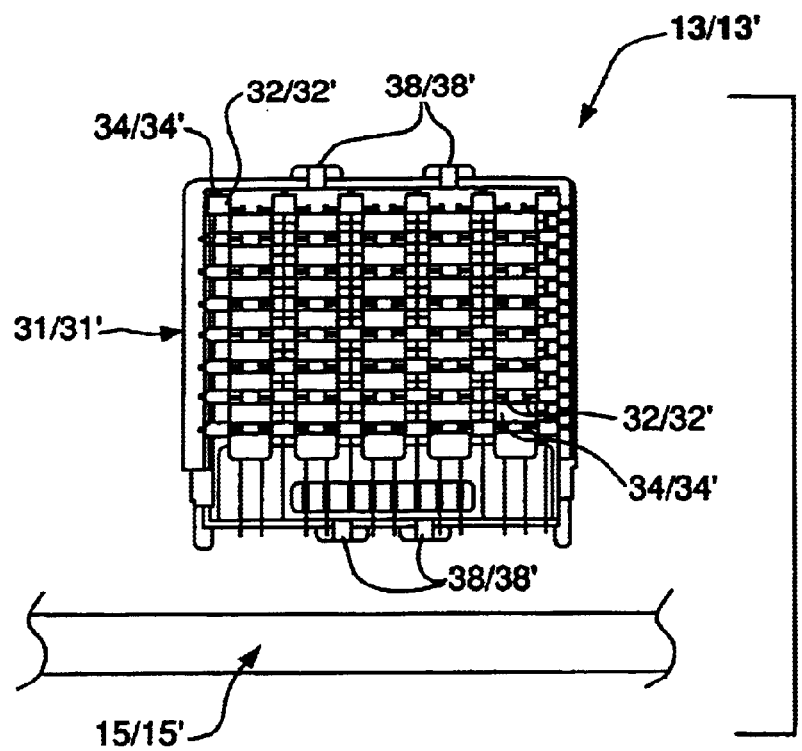
FIG. 9 is a front view of the receptacle and backplane shown in FIG. 8.

The receptacle 13 comprises a main housing 30, and a forward housing 31 mechanically coupled to the forward housing 30 (see FIGS. 8 and 9). The receptacle 13 also comprises a plurality of female contacts 32 arranged in an eight row, five column array that substantially matches the array of male contacts 22 of the header 12.

The female contacts 32 are each positioned within a respective channel 34 formed in the forward housing 30. Each female contact 32 is attached to a respective lead (not shown) that extends through the main housing 31. The leads each have a ninety-degree bend formed therein, and terminate at a pin 36 that extends downward from the main housing 31. The pins 36 are each received in a respective mounting hole (not shown) formed in the backplane 15. The pins 36 contact leads positioned within the mounting holes, thereby establishing electrical contact between the receptacle 13 and the backplane 15.

The forward housing 30 has two raised portions 38 formed on an upper surface thereof, and two additional raised portions 38 formed on a lower surface thereof. The raised portions 38 on the upper surface are spaced apart by an amount approximately equal to the spacing between one of the pairs of slots 28 in the housing 20; the raised portions 38 on the lower surface are spaced apart by an amount approximately equal to the spacing between the other pair of slots 28 in the housing 20.

The header 12 and the receptacle 13 are mated by substantially aligning each pair of slots 28 with the corresponding pair of raised portions 38, and urging the header 12 and the receptacle 13 toward each other by the application of force to one or both of the header 12 and the receptacle 13. The unequal spacing between the raised portions 38 on the upper and lower surfaces of the forward housing 30 ensures that the header 12 and the receptacle 13 are positioned in the correct orientation for mating. Moreover, the tabs 20f on the housing 20 each have a beveled edge (see FIG. 6) that assists aligning the header 12 and the receptacle 13.

The raised portions 38 engage the housing 20 of the header 12 by way of the slots 28. Continued movement of the header 12 toward the receptacle 13 causes a portion of the forward housing 30 to become disposed within the housing 20. (The raised portions 38 and the slots 28 thus function as complementary mating features for the receptacle 13 and the header 12.) Movement of the header 12 toward the receptacle 13 also causes the female contacts 32 of the receptacle 13 to engage the male contacts 22 of the header 12. The header 12 and the receptacle 13 are urged toward each other until the forward housing 30 abuts the bottom portion 20a of the housing 20. The header 12 and the receptacle 13 (and the male and female contacts 22, 32) are fully mated at this point.

Further details relating to the receptacle 13 and the header 12 are not necessary to an understanding of the invention, and therefore not included herein.

The second cover 50' is substantially identical to the first cover 50. Corresponding components of the covers 50, 50' are designated herein by identical reference numerals, with the reference numerals corresponding to the second cover 50' followed by a prime (') symbol. The following description of the first cover 50 applies equally to the second cover 50', unless otherwise noted.

The cover 50 comprises a substantially planar top member 50a, and side members 50b, 50c (see FIGS. 1–4). The side members 50b, 50c adjoin opposing ends of the top member 50a, and extend in a direction substantially perpendicular to the top member 50a.

The side members 50b, 50c each have two raised portions 50d formed on an outwardly-facing surface thereof. The raised portions 50d extend substantially in the vertical direction. The raised portions 50d are substantially similar to the raised portions 38 on the forward housing 30 of the receptacle 13. The raised portions 50d on the side member 50b are spaced apart by an amount approximately equal to the spacing between one of the pairs of slots 28 in the housing 20; the raised portions 50d on the side member 50c are spaced apart by an amount approximately equal to the spacing between the other pair of slots 28.

The cover 50 is preferably formed from a material capable of withstanding the temperatures within the convection reflow oven. For example, the cover 50 can be formed from high-temperature, glass-filled LPC, UL 94V-0.

The cover 50 mates with the housing 20 of the header 12. More specifically, the raised portions 50d each fit snugly within a respective one of the slots 28 formed in the housing 20. In other words, the cover 50 is mated with the header 12 using some of the features that mate the header 12 with the receptacle 13. The cover 50 is installed on the header 12 by substantially aligning each of the raised portions 50d with a corresponding slot 28. The cover 50 is the urged in the direction denoted by the arrow 73 in FIG. 11 so that the raised portions 50d engage the header 22 by way of the slots 28.

Figure 12:
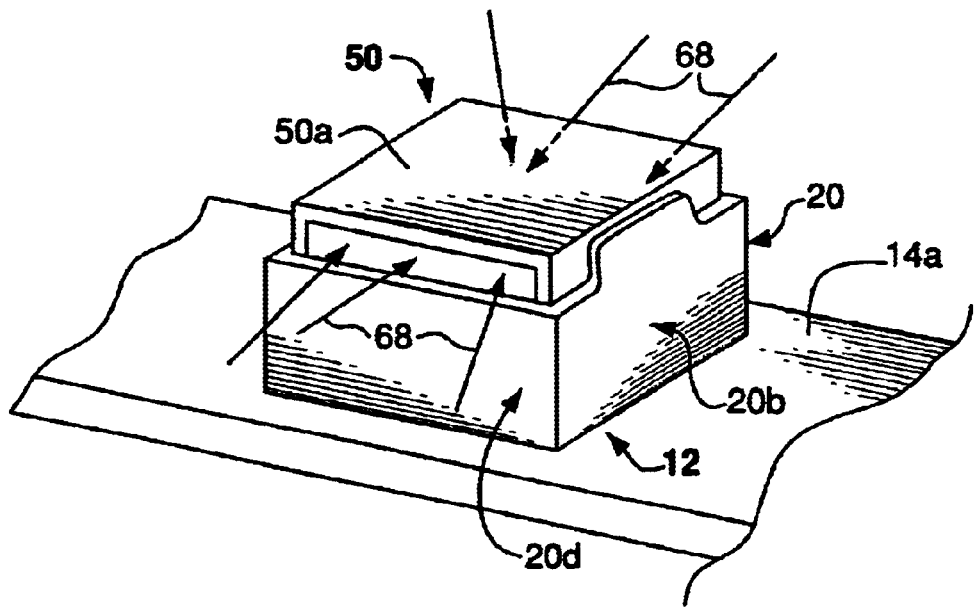
FIG. 12 is a top perspective view of the BGA header, the PCB, and the cover shown in FIGS. 1–7, 10, and 11, located in a convection reflow oven, with the cover mated with the BGA header and in an open position.

The cover 50 is movable in the vertical direction between a lower, or closed, position (see FIG. 13), and an upper, or open, position (see FIG. 12). The cover 50 is preferably secured to the housing 20 by friction between the raised portions 50d and the contacting surfaces of the housing 20. The raised portions 50d each slide within a respective one of the slots 28 as the cover 50 is moved between the open and closed positions. (The raised portions 50d and the slots 28 thus function as complementary mating features for the cover 50 and the header 12.)

The cover 50 is moved from the open to the closed position by pushing the top member 50a downward to overcome the friction between the raised portions 50d and the contacting surfaces of the housing 20. The cover 50 is moved from the closed to the open position (and can be removed from the header 22) by grasping the top member 50a and pulling the top member 50a upward to overcome the friction between the raised portions 50d and the contacting surfaces of the housing 20.

Figure 13:
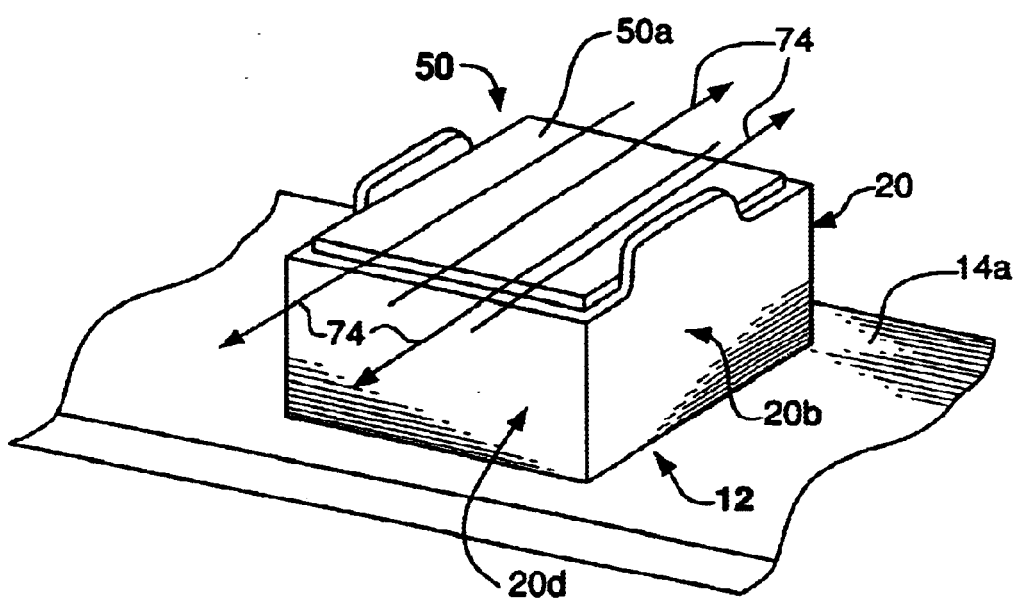
FIG. 13 is a top perspective view of the BGA header, the PCB, and the cover shown in FIGS. 1–7, 10–13, located in a convection reflow oven, with the cover mated with the BGA header and in a closed position.

A substantial gap is present between the top portion 50a of the cover 50 and the housing 20 when the cover 50 is in the open position, as shown in FIG. 12. Movement of the cover 50 to the closed position substantially eliminates this gap, as shown in FIG. 13. In other words, movement of the cover 50 to the closed position causes the side portions 50b, 50c to move into the housing 20, and the top portion 50a to assume a position closely spaced from (or contacting) the housing 20 so that the top portion 50a covers the housing 20. The significance of these features is explained below.

Details relating to the mounting of the headers 22, 22' on the PCB 14 are as follows.

The header 22 is initially placed on the first surface 14a of the PCB 14, with the cover 50 in its open position and the first surface 14a facing upward. (Solder paste is preapplied to the first surface 14a prior to placement of the header 12 on the surface 14a.) The header 22 is positioned so that the mounting legs 20g on the housing 20 become disposed in corresponding mounting holes (not pictured) extending into the PCB 14 from the first surface 14a. Positioning the mounting legs 20g in the mounting holes causes each of the solder balls 49 of the header 12 to substantially pre-align with a respective electrical contact point, such as a solder pad 66a, on the first surface 14a (the solder pads 66a are depicted in FIG. 5 only, for clarity). For further information on this aspect of alignment, reference should be made to assignee's co-pending U.S. patent application Ser. No. 09/691,811, filed Oct. 19, 2000, whose contents are incorporated by reference herein.

The header 12 is preferably positioned on the first surface 14a using a suitable automated placement system of conventional design (not pictured in full). The automated placement system preferably comprises a vacuum pickup 60 (see FIG. 11) that grasps the top member 50a of the cover 50, and lifts the header 12 by way of the cover 50. (The substantially planar configuration of the top member 50a makes the top member 50a well suited for this purpose.)

The PCB 14 and the header 12 are subsequently placed on a conveyor that transports the PCB 14 and the header 12 into and through a convection reflow oven under conditions applicable to the particular application, as is well known in the art of connector manufacturing. (The conveyor and the convection reflow oven can be of conventional design well known to those skilled in the art of connector manufacturing, and therefore are not shown in the figures.) The cover 50 is in its upper position, the surface 14a of the PCB 14 faces upward, and the header 12' is not positioned on the PCB 14 at this point.

Typically, such convection reflow ovens operate by gas, e.g., air, directed (forced) into the oven. The heated air circulates throughout the oven. A portion of the heated air passes into the housing 20 by way of the above-mentioned gap between the top portion 50a of the cover and the housing 20. The heated air passing into the housing 20 through the gap is represented diagrammatically by the arrows 68 in FIG. 12. It should be noted that the arrows 68 are depicted for illustrative purposes only, and are not intended to represent the relatively complex airflow patterns that actually exist within the oven.

Convective heat transfer occurs between the heated air within the housing 20 and the male contacts 22 of the header 12. The ensuing conductive heat transfer along the length of each male contact 22 heats the solder ball 49 affixed thereto. (It should be noted that, although the heated air entering the housing 20 is a primary source of heating for the solder balls 49, the solder balls 49 are also heated by other sources, such as the direct impingement of the heated air thereon.)

Figure 10:
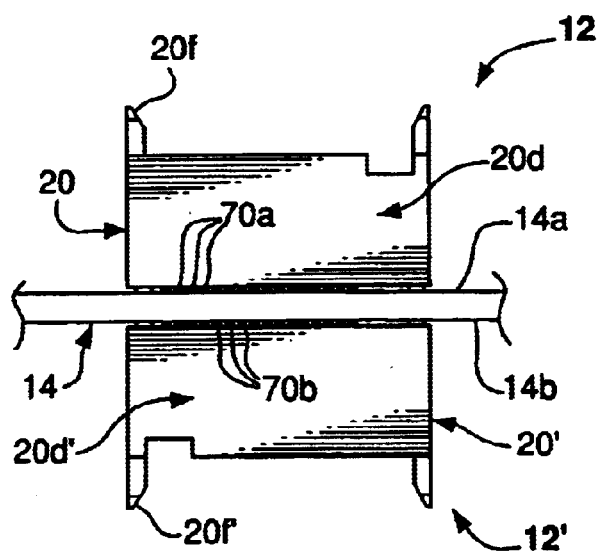
FIG. 10 is a side view of the BGA header shown in FIGS. 5–7 and a substantially identical BGA header mounted on opposing sides of the PCB shown in FIGS. 5–7.
Figure 11:
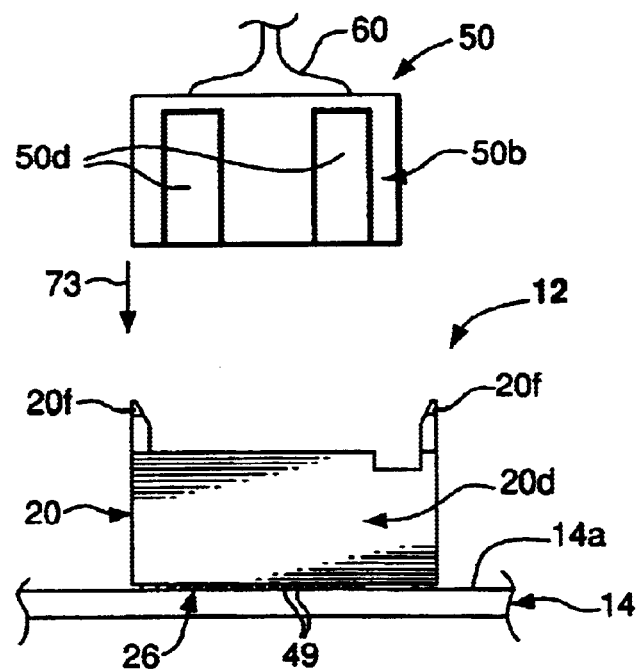
FIG. 11 is a side view of the BGA header, the PCB, and the cover shown in FIGS. 1–7 and 10, with the BGA header and the cover in an un-mated condition and the cover suspended from a vacuum pickup.

The heating of the solder balls 49 eventually causes the solder balls 49 to melt and form solder joints 70a between each corresponding pair of male contacts 22 and solder pads 66a (the solder joints 70a are depicted diagrammatically in FIG. 10). More specifically, the PCB 14 and the header 12 remain in the oven for a period of time sufficient to permit the solder balls 49 to melt (liquefy) as a result of the above-noted heating thereof. (The optimal dwell time of the PCB 14 and the header 12 in the oven is determined by factors such as the speed of the conveyor, the distance traveled by the PCB 14 and the header 12 through the oven, and the temperature of the heated air introduced into the oven.)

The liquid solder from the solder balls 49 is allowed to cool after the PCB 14 and the header 12 exit the oven. The liquid solder, upon cooling, solidifies into the solder joints 70a. (The process of heating and melting the solder balls 49 of the header 12 and solidifying the liquid solder into the solder joints 70a is hereinafter referred to as "the initial reflow operation.")

The solder coating on the mounting legs 20g melts in response the heating thereof by the heated air circulating within the oven. The resulting flow of solder, upon cooling, forms a bond with the PCB 14 and thereby helps to secure to the header 12 to the PCB 14.

The cover 50 of the header 12 is subsequently moved to the closed position, and the PCB 14 and the header 12 are rotated (flipped) so that the second surface 14b faces upward. Solder paste is applied to the second surface 14b, the header 12' is placed on the second surface 14b, and the cover 50' is installed on the header 12' in the open position.

The header 12' is positioned on the second surface 14b in the manner described above in connection with the header 12. In other words, the mounting legs 20g' on the housing 20' of the header 12' are positioned in corresponding mounting holes extending into the PCB 14 from the second surface 14b. This action causes each of the solder balls 49' of the header 12' to substantially pre-align align (see above) with a respective solder pad 66b on the second surface 14b (the solder pads 66b are depicted in FIG. 5 only, for clarity).

The PCB 14 and the headers 22, 22' are placed on the conveyor upstream of the oven. The covers 50, 50' are in their respective closed and open positions, and the second surface 14b of the PCB 14 faces upward at this point.

The conveyor carries the PCB 14 and the headers 22, 22' into and through the convection reflow oven. Air heated to approximately the same predetermined temperature noted above with respect to the first reflow operation is directed into, and circulates throughout, the oven. A portion of the heated air passes into the housing 20' of the header 12' by way of the gap between the top portion 50a' of the cover 50' and the housing 20', in a manner substantially identical to that described above with respect to the header 12 and the cover 50. The heated air heats and melts the solder balls 49' of the header 12', in a manner substantially identical to that described above with respect to the header 12 and the solder balls 49.

The PCB 14 and the headers 22, 22' remain in the oven for approximately the same predetermined period of time noted above with respect to the first reflow process. The liquid solder is allowed to cool and solidify into solder joints 70b between each corresponding pair of male contacts 22' and solder pads 66b after the PCB 14 and the headers 22, 22' exit the oven (the solder joints 70a are depicted diagrammatically in FIG. 10). (The process of heating and melting the solder balls 49' of the header 12' and solidifying the liquid solder into the solder joints 70b is hereinafter referred to as "the second reflow operation.")

The solder coating on the mounting legs 20g' melts in response the heating thereof by the heated air circulating within the oven. The resulting flow of solder, upon cooling, forms a bond with the PCB 14 and thereby helps to secure to the header 12' to the PCB 14.

The cover 50 on the header 12 slows the heating of the previously-formed solder joints 70a during the second reflow operation. More particularly, the cover 50 is in its closed position during the second reflow operation. The top portion 50a of the cover 50 is closely spaced from, or contact, the housing 20 when the cover 50 is in its closed position, as noted previously. The cover 50 thus substantially inhibits or blocks the heated air circulating within the oven from entering the housing 28 during the second reflow operation. In other words, the cover 50 deflects a substantial portion of the heated air that would otherwise enter the housing 20 during the second reflow operation.

The heated air passing over and being deflected by cover 50 is represented diagrammatically by the arrows 74 in FIG. 13. It should be noted that the arrows 74 are depicted for illustrative purposes only, and are not intended to represent the relatively complex airflow patterns that actually exist within the oven.

The presence of heated air within the housing 20, as explained above, heats the male contacts 22 primarily by convective heat transfer. A portion of this heat is subsequently transferred to adjoining solder joints 70a primarily by conductive heat transfer through the male contacts 22. Heating of the previously-formed solder joints 70a can weaken, and in the extreme, can melt the solder joints 70a.

The header 12 is suspended from the PCB 14 primarily by the solder joints 70a during the second reflow process. Suspending the header 12 in this manner subjects the solder joints 70a to additional stresses. Weakening of the solder joints 70a during the second reflow operation is therefore of particular concern. More specifically, such weakening, in conjunction with the added stress on the solder joints 70a, can damage the solder joints 70a and, in the extreme, can cause the header 12 to separate from the PCB 14.

The cover 50, by substantially decreasing the heating experienced by the male contacts 22 during the second reflow operation, can substantially reduce the temperature rise in (and the weakening of) the solder joints 70a during the second reflow operation. In other words, the cover 50 is believed to have an insulating effect on the solder joints 70a that protects the solder joints 70a from the potentially damaging effects of the second reflow operation.

The covers 50, 50' can remain on the respective headers 22, 22' (in the closed position) until the corresponding receptacles 18, 18' are mated thereto. The covers 50, 50' can thereby protect the headers 50, 50' from dust and other contaminates before the headers 50, 50' are mated with the corresponding receptacles 18, 18'.

Remarks made hereinafter with respect to the cover 50 also apply to the cover 50', unless otherwise indicated. The cover 50 mates with the existing mating features on the header 12, as noted above. Hence, the cover 50 can be used without any modifications to the header 20 or the PCB 14, and can be quickly and easily installed on and removed from the header 12. Moreover, the cover 50 is formed as a single piece with no moving parts, and can therefore be produced at minimal expense. The cover 50 provides the further benefit of acting as a pick-up point for an automated placement system.

It is to be understood that even though numerous characteristics and advantages of the present invention have been set forth in the foregoing description, the disclosure is illustrative only and changes can be made in detail within the principles of the invention to the full extent indicated by the broad general meaning of the terms in which the appended claims are expressed.

For example, the use of the cover 50 in conjunction with the header 12 has been described for exemplary purposes only. The cover 50 can be configured to mate with virtually any type of connector, including receptacle-type connectors. Moreover, specific details of the mating features of the cover 50 and the housing 12 have been presented for exemplary purposes only. Numerous variations in the mating features are possible within the contemplated scope of the invention. For example, an alternative embodiment of the cover 50 can be configured with slots such as the slots 28 of the housing 20, and an alternative embodiment of the housing 20 can be configured with features, such as the raised portions 28 of the cover 50, that engage the alternative cover by way of the slots formed therein.

In addition, more than one of the headers 12, 12' can be mounted on each of the surfaces 14a, 14b of the PCB 14. Moreover, the headers 12, 12' do not necessarily have to be vertically aligned as depicted in FIG. 10.

What is claimed is:

1. A cover for a ball-grid array connector, comprising a top member and no more than a first and a second side member adjoining opposing ends of the top member so that the cover is substantially U-shaped, the first and second side members each having a raised portion formed thereon for engaging a housing of the ball grid array connector by way of respective slots formed in the housing, the raised portions being configured to slide within the respective slots so that the cover is movable in relation to the housing when the cover is mated with the ball-grid array connector.

2. The cover of claim 1, wherein the first and second side members each have two of the raised portions formed thereon.

3. The cover of claim 1, wherein the raised portions on the first side member are spaced apart by a first distance and the raised portions on the second side member are spaced apart by a second distance unequal to the first distance.

4. The cover of claim 1, wherein the cover is retained on the housing by a friction fit between the raised portions and the contacting surfaces of the housing.

5. The cover of claim 1, wherein the cover is movable between a first position wherein the top portion is spaced from the housing by a first distance, and a second position wherein the top portion is spaced from the housing by a second distance, the second distance being unequal to the first distance.

6. The cover of claim 5, wherein the top portion covers the housing when the cover is in the first position.

7. A cover for a ball-grid array connector, comprising a top member and a first and a second side member adjoining opposing ends of the top member, the first and the second side members each having a mating feature formed thereon for engaging a housing of the ball-grid array connector by way of a respective complementary mating feature formed in the housing so that the cover is movable between a first and a second position in relation to the housing, wherein the cover is completely electrically-non-conductive.

8. The cover of claim 7, wherein the mating features formed on each of the first and second side portions comprise a raised portion adapted to engage the housing by way of a respective slot formed in the housing.

9. The cover of claim 8, wherein the mating features formed on each of the first and second side portions comprise two of the raised portions, the raised portions on the first side member are spaced apart by a first distance, and the raised portions on the second side member are spaced apart by a second distance unequal to the first distance.

10. The cover of claim 8, wherein the cover is retained on the housing by a friction fit between the raised portions and the contacting surfaces of the housing.

11. The cover of claim 7, wherein the cover is movable between a first position wherein the top portion is spaced from the housing by a first distance, and a second position wherein the top portion is spaced from the housing by a second distance, the second distance being unequal to the first distance.

12. The cover of claim 11, wherein the top portion covers the housing when the cover is in the first position.

13. A kit for mounting a ball-grid array connector on a substrate, comprising:
the ball-grid array connector, the ball-grid array connector comprising a housing, a plurality of electrical contacts mounted within the housing, and a grid array of fusible elements each being mechanically coupled to a respective one of the electrically-conductive elements; and
a cover for mating with the housing and movable between a first position on the housing wherein a portion of the cover is closely spaced from the housing so that the cover substantially isolates the electrical contacts from a heated gas flowing over the ball-grid array connector, and a second position wherein the portion of the cover is spaced from the housing so that the heated gas enters the housing and heats the electrical contacts.

14. The kit of claim 13, wherein the housing has mating features for engaging complementary mating features on a second connector matable with the ball-grid array connector, and the cover has mating features that engage the mating features of the housing.

15. The kit of claim 14, wherein the cover comprises a top member and a first and a second side member adjoining opposing ends of the top member, the mating features of the cover being formed on the first and second side members.

16. The kit of claim 15, wherein the portion of the housing comprises the top portion.

17. The kit of claim 13, wherein the heated gas enters the housing when the cover is in the second position and heats the electrical contacts so that the electrical contacts each heat a respective one of the fusible elements.

18. The kit of claim 13, wherein the grid array of fusible elements comprises a plurality of solder balls.

19. A kit for mounting a ball-grid array connector on a substrate, comprising:
the ball-grid array connector, the ball-grid array connector comprising a housing having mating features for engaging complementary mating features on a second connector matable with the ball-grid array connector, a plurality of electrical contacts mounted on the housing, and a grid array of fusible elements each mechanically coupled to a respective one of the electrical contacts; and
a cover for mating with the ball-grid array connector, the cover comprising a top member and no more than a first and a second side member adjoining opposing ends of the top member so that the cover is substantially U-shaped, the cover having mating features that engage the mating features of the ball-grid array connector, the cover being movable between a first and a second position in relation to the ball-grid array connector.

20. The kit of claim 19, wherein the cover comprises a top member and a first and a second side member adjoining opposing ends of the top member.

21. The kit of claim 20, wherein the top member is closely spaced from and covers the housing when the cover is in the first position so that the electrical contacts are substantially isolated from a heated gas flowing over the ball-grid array connector, and the top member of the cover is spaced from the housing when the cover is in the second position so that the heated gas enters the housing and heats the electrical contacts.

22. The kit of claim 20, wherein the mating features of the cover comprise a raised portion formed on each of the side members and the mating features of the cover comprise slots configured to received a respective one of the raised portions.

* * * * *